United States Patent [19]

Choi

[11] Patent Number: 5,197,031
[45] Date of Patent: Mar. 23, 1993

[54] METHOD FOR WRITING DATA IN TESTING MEMORY DEVICE AND CIRCUIT FOR TESTING MEMORY DEVICE

[75] Inventor: Hoon Choi, Taegu, Rep. of Korea

[73] Assignee: Samsung Electronics Co., Ltd., Suweon, Rep. of Korea

[21] Appl. No.: 827,578

[22] Filed: Jan. 29, 1992

Related U.S. Application Data

[63] Continuation-in-part of Ser. No. 768,455, Sep. 27, 1991, which is a continuation of Ser. No. 470,119, Jan. 24, 1990, abandoned.

[30] Foreign Application Priority Data

Jun. 10, 1989 [KR] Rep. of Korea .................. 89-8002

[51] Int. Cl.$^5$ ........................................... G11C 13/00
[52] U.S. Cl. .................................... 365/201; 365/203; 365/189.05; 371/24
[58] Field of Search ................... 365/201, 203, 189.05; 371/24, 25.1, 21.1

[56] References Cited

U.S. PATENT DOCUMENTS 4,670,878 6/1987 Childers ............................. 365/201
4,815,040 3/1989 Matsui et al. ...................... 365/203

Primary Examiner—Terrell W. Fears
Attorney, Agent, or Firm—Ladas & Parry

[57] ABSTRACT

A circuit for testing a memory device includes a data writing circuit, a data checking circuit, and a control circuit. A method for writing data in testing the memory device comprises the steps of generating a voltage difference between a pair of bit lines B/L and $\overline{B/L}$, and storing directly data corresponding to the voltage difference in a capacitor of a memory cell. Direct writing of data on the bit lines is performed. Moreover, each memory cell is totally checked during one cycle, and the test time is greatly reduced.

4 Claims, 1 Drawing Sheet

METHOD FOR WRITING DATA IN TESTING MEMORY DEVICE AND CIRCUIT FOR TESTING MEMORY DEVICE

This is a continuation-in-part of copending application Ser. No. 07/768,455 filed on Sep. 27, 1991 which is continuation of application Ser. No. 07/470,119 filed Jan. 24, 1990 (now abandoned).

BACKGROUND OF THE INVENTION

This invention relates to a semiconductor memory device such as a dynamic random access memory (DRAM), and more particularly to a method which can reduce the test time of high-density, highly integrated memory devices, and a circuit which can test the memory devices.

Memory devices integrated by the semiconductor manufacturing processes require various precise processes in proportion to the increase of integration density of the memory devices. Thus, when such processes are performed, dust or contaminants must be avoided. But, as the density of the memory devices increases, the fault ratio of bad to good devices also increases. Accordingly, the memory devices have a built-in RAM test circuit to test internally the RAM. Even if the RAM test is internally carried out, however, the test time becomes longer in proportion to the integration density.

That is, in the conventional RAM test, the RAM test is carried out by a bit unit ($\times 4, \times 8, \times 16$) using test signals. The time spent for testing increases in accordance with the integration density/xbit. Accordingly, the more integration density increases, the more test time increases, since the writing and reading of data operations are performed by a xbit unit through input-/output lines and the written and read data is compared with each other to check for errors.

SUMMARY OF THE INVENTION

It is an object of this invention to provide a method for testing a memory device, such as a DRAM, which method can check for the proper presence of test data and also reduce the test time by writing and reading directly the data on a pair of bit lines without the use of input/output (I/O) lines, and comparing the written and read data with each other to check for errors.

It is another object of this invention to provide a RAM test circuit for implementing this method.

In order to achieve the above described objects, the present invention resides in a method for writing data in testing a memory device. The method comprises the steps of generating a voltage difference between a pair of bit lines by selecting MOS transistors by means of various control signals from a control circuit to write directly the data on the pair of bit lines without using the I/O lines of the devices, and storing directly the data in a capacitor of a memory cell selected by a word line.

The present invention further resides in a method for writing data in testing a memory device. The method comprises the steps of generating directly a voltage difference between a pair of bit lines by selecting at least one MOS transistor by means of a control circuit, providing the pair of bit lines with supply voltage level (Vcc-level) or ground level (GND-level) by means of a sense amplifier, and storing the data in a capacitor of a memory cell selected by a word line.

The present invention still further resides in a circuit for testing including a plurality of sense amplifiers each connected to a different pair of bit lines, a plurality of memory cells each connected to a pair of bit-lines and a word-line, a plurality of MOS transistors turned on by a column-selecting signal to connect I/O lines to each pair of bit lines respectively, the circuit further comprising a data-writing means for writing data into a memory cell while charging the corresponding pair of bit lines to Vcc-level and GND - level by using MOS transistors directly connected to the pair of bit lines, a data checking means connected to the corresponding sense amplifier for checking the read data, and a control circuit for controlling the data-writing means and the checking means.

According to the present invention, direct data writing on the bit lines is performed. Moreover, each memory cell can be totally checked during one cycle, and the test time can be largely reduced since the data is written into each memory cell connected to a selected word line and any error is checked at each bit line.

BRIEF DESCRIPTION OF THE INVENTION

FIG. 1 shows a circuit of an embodiment according to this invention.

DETAILED DESCRIPTION OF THE PREFERRED EMBODIMENTS

Figure 1:
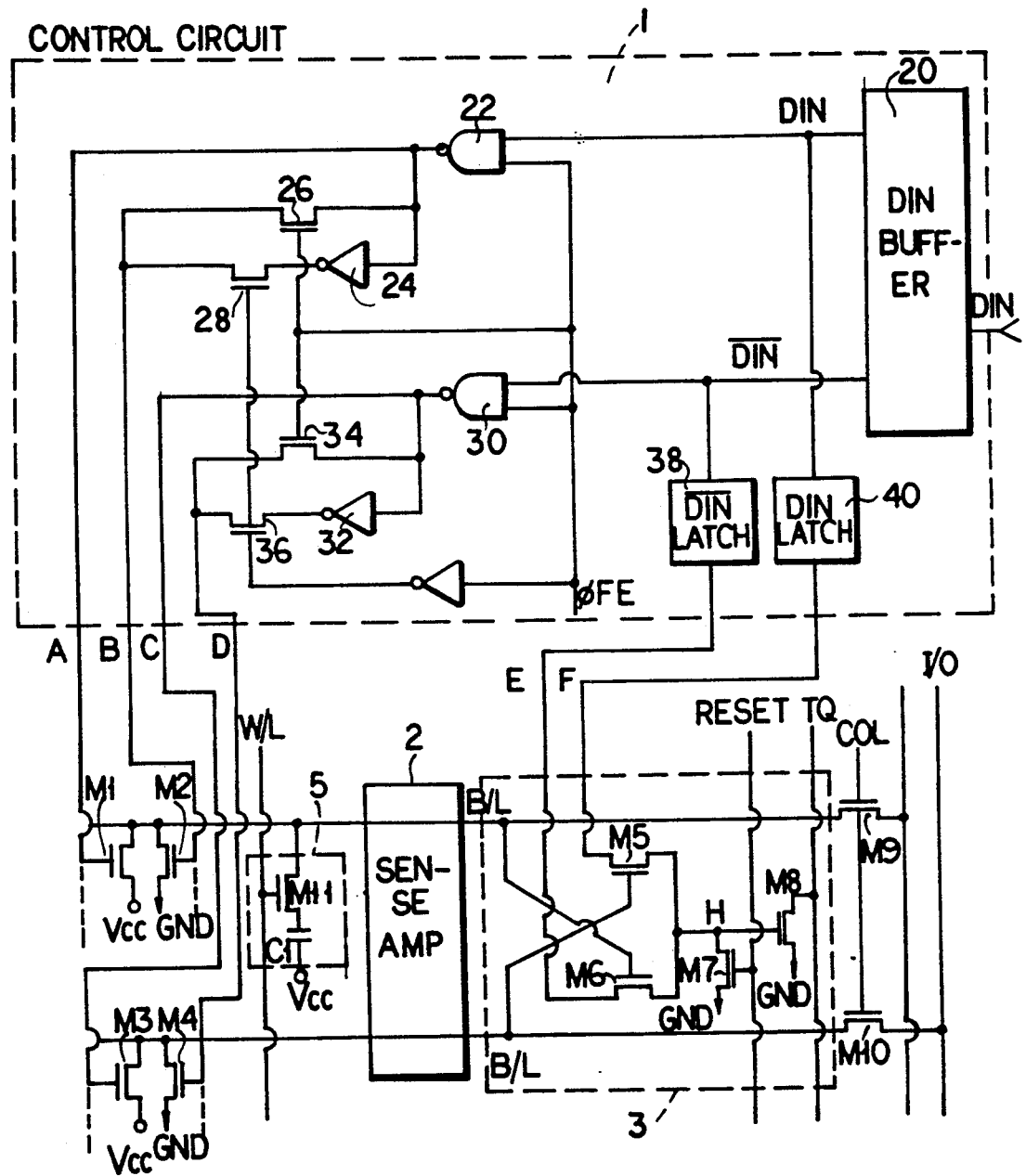

The present invention will be now described in more detail with the accompanying drawing. As shown in FIG. 1, a sense amplifier 2 is located between a pair of bit lines B/L and $\overline{B/L}$ in order to detect a voltage difference between the bit lines. A memory cell 5 is connected between the bit line B/L and a word line W/L. The memory cell 5 has an NMOS transistor M11 and a capacitor C1. Also, a PMOS transistor M1 and an NMOS transistor M2 are connected to the bit line $\overline{B/L}$ in order to charge the bit line to the Vcc-level and ground (GND) - level, respectively. Similarly, a PMOS transistor M3 for Vcc-level and an NMOS transistor M4 for GND-level are connected to the bit-line $\overline{B/L}$. The gates of the transistors M1–M4 are connected to a control circuit 1 through nodes A–D, respectively. In addition, NMOS transistors M5 and M6, whose gates are connected to the pair of bit lines B/L and B/L, respectively, are located to one side of the sense amplifier 2. The sources of the transistors M5 and M6 are also connected to the control circuit 1 through nodes E and F, respectively.

The voltages on the nodes A–F are determined by the control circuit 1 in response to the voltage level of a data input signal DIN provided from a central control, not shown. The control circuit 1 includes a DIN signal buffer 20 which produces two output signals DIN and $\overline{DIN}$, i.e., the original DIN signal and its logic converse. Thus, if DIN is a logic "1", having a high voltage level, $\overline{DIN}$ is a logic "0" having a low voltage level.

Under control of a high level signal øFE, which is generated by the central control when test data is to be written into the memory, the DIN signal from the buffer 20 is inverted by a NAND gate 22 and again by an inverted 24 and applied to nodes A and B via NMOS transistors 26 and 28 which are in the conducive state. Similarly, the $\overline{DIN}$ signal from the buffer 20 is inverted by a NAND gate 30 and again inverted by an inverted 32 and applied to nodes C and D via the on NMOS transistors 34 and 36. Also, the buffer output signals DIN and $\overline{DIN}$ are latched in latches 38 and 40, respectively, for application, under the control of the central control, to nodes E and F, respectively, during the reading of the test data.

When test data stored in the memory is to be read, øFE becomes low, and the voltages on the nodes A–D are such as to bias off all the transistors M1–M4. Thus, nodes A and C are at a high level to bias off the PMOS transistors M1 and M3, and the nodes B and D are at low levels to bias off the NMOS transistors M2 and M4.

An NMOS transistor M7 connected to a RESET line is connected to a common node H of the NMOS transistors M5 and M6, and an error generating line TQ is connected through an NMOS transistor M8 to the common node H. The transistors M5, M6, M7 and M8 form a check circuit 3. At one side of this check circuit 3, NMOS transistors M9 and M10, which are turned on by a column signal COL, are connected to I/O lines so that the bit lines and the I/O lines are connected to each other. A DIN signal determines state signals which are provided to each node A–F from the control circuit 1 when test data is written and read.

The inventive circuit performs the same data memory functions as a conventional DRAM, and during such functions, the MOS transistors M1–M4 are cut off.

In the memory writing operation of the inventive circuit, the MOS transistors M9 and M10 are turned on by the column selecting signal COL to connect the I/O lines to the pair of bit lines B/L and $\overline{B/L}$ and to the sense amplifier 2. The sense amplifier 2 charges a predetermined voltage into the capacitor C1 of the DRAM cell selected by the word line W/L and column selecting line COL through the bit lines and the MOS transistor M11.

Next, for the reading operation, the MOS transistor 11 is turned on by the word line W/L and the charge stored in the capacitor C1 is then discharged to the bit line B/L. The sense amplifier 2 detects and amplifies the voltage level signal on the bit line in order to transfer the detected signal level to the I/O lines. Such operation is the same as in conventional DRAM devices. By contrast, the present inventive circuit does not use the I/O lines for testing purposes, and during such testing the transistors M9 and M10 connecting the I/O lines are cut off.

The RAM test is to write and read data into and from the RAM and to compare two data sets after reading the recorded data. The RAM test can be divided into two methods according to the present invention. That is, one method uses the sense amplifier 2 during the reading operation, while the other method does not use the sense amplifier 2.

First, the method without using the sense amplifier 2 is described. In this operation, the data is directly provided to the bit line B/L in order to store the data in the capacitor C1 of the DRAM cell during the writing operation. After the desired word line W/L is selected, the control circuit 1 maintains the output node A at a low-level, and the PMOS transistor M1 is then turned on to provide the supply voltage Vcc to the bit line B/L. When the supply voltage Vcc is provided to the bit line B/L, the MOS transistor M11 selected by the word line W/L is turned on to charge the capacitor C1. Here, even though only one MOS transistor M11 and one capacitor C1 are shown in FIG. 1, a number of MOS transistors and capacitors for the memory can be connected in parallel to the word line. Also the supply voltage corresponding to the data is applied to charge the DRAM cell selected by the word line W/L. At this time, the data on the bit line B/L is latched by the control circuit 1 and is loaded on to the nodes E and F and, during the reading operation of this method, the sense amplifier 2 does not operate.

Next, the method using the sense amplifier 2 is described.

When the control circuit 1 provides the state signals of high level and low level to the nodes D and A, respectively, to turn the MOS transistors M1 and M4 on, the bit lines B/L and $\overline{B/L}$ are connected to ground potential and Vcc potential, respectively, and a voltage difference is generated between the pair of bit lines B/L and $\overline{B/L}$. Thereafter, the sense amplifier 2 detects and amplifies this differential voltage and charges the data corresponding to the difference voltage into the capacitor C1 by providing the bit line B/L with Vcc-level or GND-level.

The comparative operation to compare two data sets after reading the data stored in the DRAM cell by either of the two writing methods is as follows.

First, the control circuit 1 provides the state signal of high level to the nodes A and C and the state signal of low level to the nodes B and D to turn off the MOS transistors M1, M2, M3 and M4. Next, assuming that the data stored in the DRAM cell is "1" and the MOS transistor M11 is turned on by the word line W/L, the charge stored in the capacitor C1 is discharged to the bit-line B/L. The sense amplifier 2 detects this voltage so that the bit-line $\overline{B/L}$ comes to a high level, while B/L comes to a low level. Until these levels are set, both the nodes E and F are maintained at a low level. Thereafter, the control circuit 1 provides, in the case of "1" data, the state signals of low and high level to the nodes E and F, respectively, so that the data is checked in the check circuit 3. That is, the low level signal of the bit line $\overline{B/L}$ is applied to the gate of the MOS transistor M5, while the high level signal of the bit line B/L is applied to the gate of the MOS transistor M6. Then, the MOS transistor M5 is cut off, but the MOS transistor M6 is turned on so that the low level state is transferred to the node H and the MOS transistor M8 is continuously cut off.

Therefore, the error line TQ, precharged to a high level, is maintained at the high level state during the reading operation of the fast test, and indicates that the memory cell being tested is normal. If there is an error when the data stored in the memory cell is read, the signal of high level is transferred to the node H in order to turn the MOS transistor M8 on so that the error-generating line TQ becomes a low level thereby indicating that an error is present. Thus, when one of a number of memory cells is faulty or each cell is faulty, the common node H comes to a high level as described above and indicates that there is an error in the DRAM under test.

The MOS transistor M7 connected to the RESET line resets the node H to ground level for the next test operation. Namely, during the writing and reading operation, the control circuit 1 determines previously the data (1 or 0) being stored in the memory cell as the output of the nodes A–D and provides the check signal to the nodes E and F of the check circuit 3 to test the DRAM.

As mentioned above, the present invention checks whether the data is normal or not in the check circuit 3 by writing directly and reading the data on the bit-lines without the use of the I/O lines. The writing operation of data at each of the memory cells connected to the selected word line is done during one cycle and the reading operation and the error checking operation of the data stored in each of the memory cells are also done during one cycle, thereby greatly reducing the DRAM testing time.

The invention is in no way limited to the embodiment described hereinabove. Various modifications of the disclosed embodiment as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. A circuit for testing a memory device of the type including a plurality of sense amplifiers connected to a pair of bit lines, a plurality of memory cells connected to the bit lines and a word line, a plurality of first MOS transistors turned on by a column selecting signal to connect I/O lines to a pair of bit lines, the testing circuit comprising:

means for providing a preselected one of a Vcc-level or a GND-level provided at terminals of a voltage source to one line of the pair of bit lines and the other of said levels to the other of said bit lines by using a plurality of second MOS transistors connected between said terminals and the pair of bit lines for providing a preselected voltage difference between the bit lines, said sense amplifiers being responsive to said voltage difference for writing and storing preselected data corresponding to said preselected voltage difference in said memory cells; and data reading means connected to each of the sense amplifiers for reading the data stored in said memory cells and for determining if the read-out data corresponds to said preselected data.

2. A circuit according to claim 1 wherein the plurality of second MOS transistors includes PMOS transistors connected to the pair of bit lines for providing the Vcc-level to either of the lines of the pair of bit lines, and NMOS transistors connected to the pair of bit lines for providing the GND-level to either of the lines of the pair of bit lines.

3. A circuit according to claim 1 wherein said means for providing a preselected one of a Vcc-level or a GND-level includes a control circuit for generating, in response to an input thereto of a data signal, a plurality of data signals applied to the gates of said second MOS transistors for selectively turning-on said second MOS transistors for providing said preselected voltage difference between the bit lines.

4. A circuit according to claim 3 wherein said control circuit includes a data input buffer having an input terminal for receipt of said data signal, and a pair of output terminals at which are generated said data signal and the logic converse of said data signal, respectively.

* * * * *